United States Patent
Zhu et al.

(10) Patent No.: US 10,446,507 B2
(45) Date of Patent: Oct. 15, 2019

(54) SEMICONDUCTOR DEVICES AND SEMICONDUCTOR DICE INCLUDING ELECTRICALLY CONDUCTIVE INTERCONNECTS BETWEEN DIE RINGS

(71) Applicant: Micron Technology, Inc., Boise, ID (US)

(72) Inventors: Hongbin Zhu, Boise, ID (US); Qinglin Zeng, Boise, ID (US); Daniel Osterberg, Boise, ID (US); Merri L. Carlson, Boise, ID (US); Gordon A. Haller, Boise, ID (US); Jeremy Adams, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 15/691,303

(22) Filed: Aug. 30, 2017

(65) Prior Publication Data

US 2019/0067216 A1 Feb. 28, 2019

(51) Int. Cl.
*H01L 23/58* (2006.01)
*H01L 23/528* (2006.01)
*H01L 23/522* (2006.01)
*H01L 23/00* (2006.01)

(52) U.S. Cl.
CPC .......... *H01L 23/585* (2013.01); *H01L 23/528* (2013.01); *H01L 23/5226* (2013.01); *H01L 23/562* (2013.01)

(58) Field of Classification Search
CPC ......... H01L 2924/00; H01L 2924/0002; H01L 2924/181; H01L 23/585; H01L 2924/14; H01L 23/562; H01L 23/5226; H01L 23/564; H01L 23/528–5286
See application file for complete search history.

(56) References Cited

U.S. PATENT DOCUMENTS

| | | | |
|---|---|---|---|
| 5,136,364 | A | 8/1992 | Byrne |
| 5,631,191 | A | 5/1997 | Durand et al. |
| 5,774,000 | A | 6/1998 | Vercellotti et al. |
| 5,831,330 | A | 11/1998 | Chang |
| 5,847,446 | A | 12/1998 | Park et al. |
| 6,396,135 | B1 | 5/2002 | Narvaez et al. |
| 6,492,716 | B1 | 12/2002 | Bothra et al. |
| 7,230,323 | B2 | 6/2007 | Lee et al. |

(Continued)

OTHER PUBLICATIONS

Ireland et al., U.S. Appl. No. 15/283,327 titled Electronic Component Guard Ring, filed Oct. 1, 2016.

*Primary Examiner* — Amar Movva
(74) *Attorney, Agent, or Firm* — TraskBritt

(57) ABSTRACT

A semiconductor device includes a semiconductor die comprising integrated circuitry over a substrate of a semiconductor material. A first die ring comprises one or more electrically conductive materials at least partially surrounding the integrated circuitry, the one or more electrically conductive materials comprising an electrically conductive path from proximate a surface of the substrate to an exposed surface of the semiconductor die. A second die ring comprises an electrically conductive material and is disposed around the first die ring. A first electrically conductive interconnect electrically connects the first die ring and to second die ring. Related semiconductor devices and semiconductor dice are disclosed.

25 Claims, 6 Drawing Sheets

(56) References Cited

U.S. PATENT DOCUMENTS

| | | |
|---|---|---|
| 8,338,937 B2 | 12/2012 | Elliott et al. |
| 9,287,379 B2 | 3/2016 | Meldrim et al. |
| 9,557,376 B2 | 1/2017 | Dennison et al. |
| 9,627,332 B1* | 4/2017 | Liang .................... H01L 23/564 |
| 2002/0167071 A1 | 11/2002 | Wang |
| 2003/0235994 A1 | 12/2003 | Pan et al. |
| 2007/0262370 A1 | 11/2007 | Okada |
| 2008/0083959 A1* | 4/2008 | Wu ....................... H01L 23/585 |
| | | 257/416 |
| 2008/0191205 A1 | 8/2008 | Tsai et al. |
| 2009/0201043 A1 | 8/2009 | Kaltalioglu |
| 2009/0321734 A1* | 12/2009 | Ogawa ................... H01L 22/34 |
| | | 257/48 |
| 2011/0221460 A1 | 9/2011 | Trebo et al. |
| 2014/0070416 A1* | 3/2014 | Lu ........................ H01L 23/585 |
| | | 257/741 |
| 2015/0008431 A1 | 1/2015 | Veches |
| 2018/0096955 A1* | 4/2018 | Zhu ....................... H01L 23/585 |

* cited by examiner ured on a single wafer or other bulk semiconductor substrate. After the components and circuitry associated with each die are fabricated, a so-called dicing operation is performed on the wafer to separate the individual dice from the wafer (e.g., singulate the dice) and from each other. After dicing, the individual dice may be packaged or may be directly mounted to a semiconductor device, such as to a printed circuit board.

SEMICONDUCTOR DEVICES AND SEMICONDUCTOR DICE INCLUDING ELECTRICALLY CONDUCTIVE INTERCONNECTS BETWEEN DIE RINGS

TECHNICAL FIELD

Embodiments disclosed herein relate to semiconductor devices and semiconductor dice including electrically conductive interconnects between die rings. More particularly, embodiments of the disclosure relate to semiconductor device and semiconductor dice including die rings extending around integrated circuitry of a semiconductor die and electrically connected to each other through one or more electrically conductive interconnects, and to related methods.

BACKGROUND

During fabrication of a semiconductor die, a large number of semiconductor dice are fabricated on a single wafer or other bulk semiconductor substrate. After the components and circuitry associated with each die are fabricated, a so-called dicing operation is performed on the wafer to separate the individual dice from the wafer (e.g., singulate the dice) and from each other. After dicing, the individual dice may be packaged or may be directly mounted to a semiconductor device, such as to a printed circuit board.

Dicing includes sawing along scribe lines through portions of a wafer, termed "streets," between the dice with a mechanical saw using, for example, a diamond saw blade. Unfortunately, dicing operations often impose significant stress on the semiconductor wafer and may damage the dice as they are singulated. The potential for damage has been exacerbated by the current implementation of dice singulated from extremely thin wafers of, for example, 50 μm or less thickness. For example, the dicing may initiate fractures at the edges of the individual dice, such as at regions proximate scribe lines, during sawing. If the fractures are severe enough, they may propagate through the die and disrupt the integrated circuitry of the die. The fractures may also lead to delamination of materials within the die and may also expose the integrated circuitry of the die to the ambient environment and contaminants (e.g., moisture and ionic contaminants), potentially causing corrosion and undesired oxidation of such material. In some instances, the die or a package associated with the die may fail as a result of one or more of the fractures, the moisture, or the contaminants to which the die is exposed.

To compensate for cracking of the die, in some instances, dice may be formed with a so-called "die ring" (also sometimes referred to in the art as a "seal ring" or a "guard ring") around peripheral portions thereof surrounding integrated circuitry of the die. The die ring may include materials that are less prone to cracking or delamination when subject to a dicing operation than adjacent materials proximate the periphery of a die. Accordingly, the die rings may help reduce crack propagation from the periphery of the die to the integrated circuit region of the die during or after dicing operations.

DETAILED DESCRIPTION

Figure 1:
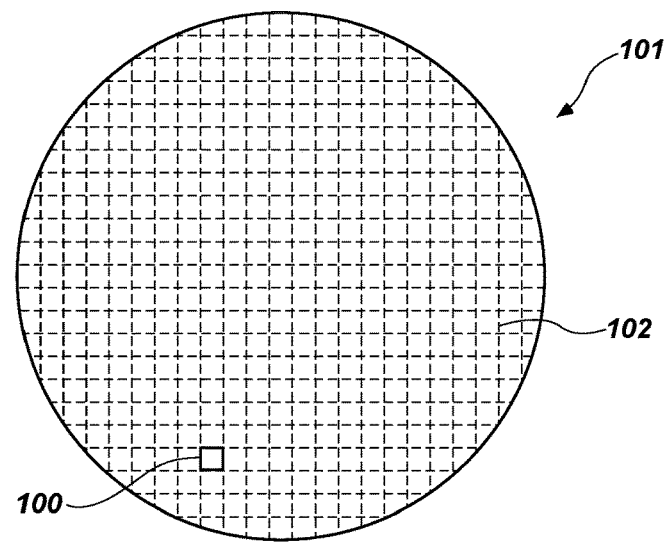
FIG. 1 is a top view of a wafer including a plurality of semiconductor dice.

The illustrations included herewith are not meant to be actual views of any particular systems or semiconductor structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor die, a semiconductor device, or a complete description of a process flow for manufacturing such semiconductor dice or semiconductor devices. The structures described below do not form complete semiconductor dice or semiconductor devices. Only those process acts and structures necessary to understand the embodiments described herein are described in detail below. Additional acts to form a complete semiconductor die or semiconductor device including the structures described herein may be performed by conventional techniques.

According to embodiments disclosed herein, a die ring structure may be disposed in a peripheral region of a semiconductor die and may include multiple die rings arranged surrounding integrated circuitry in an integrated circuitry region of the semiconductor die. The die rings may form a continuous electrically conductive path from the semiconductor material of the substrate at a level below active circuitry to an upper surface of the semiconductor die. In some embodiments, the die rings may comprise, for example, electrically conductive pads and electrically conductive interconnects extending from a surface of the die substrate material to the upper surface of the semiconductor die. The die ring structure may include a first die ring (e.g., an inner die ring), a second die ring disposed around the first die ring, a third die ring disposed around the second die ring, and a fourth die ring disposed around the third die ring. The fourth die ring may circumferentially surround the third die ring, the third die ring may circumferentially surround the second die ring, and the second die ring may circumferentially surround the first die ring. The die rings may reduce or prevent one or more of cracking of the semiconductor die during dicing operations, crack propagation after dicing operations, and contamination of the integrated circuitry of the semiconductor die. For example, the die rings may form a barrier to diffusion of moisture as well as contaminants (e.g., ionic contaminants) into the integrated circuitry region of the semiconductor die.

Electrically conductive interconnects may electrically couple at least one of the die rings to at least another of the die rings. In some embodiments, at least the first die ring may be electrically coupled to at least an adjacent die ring with one or more electrically conductive interconnects. The first die ring may comprise a continuous electrically conductive structure extending around the integrated circuitry region of the semiconductor die, when viewed from a top of the semiconductor die. Stated another way, the first die ring may include an uninterrupted electrically conductive path circumferentially surrounding the integrated circuitry region of the semiconductor die.

In some embodiments, each of the die rings is electrically connected to other of the die rings (e.g., to each of the other die rings) and exhibits a same electrical potential as the other die rings. Each of the die rings may include a continuous electrically conductive path extending around the integrated circuitry region of the semiconductor die. In some embodiments, one or more of the die rings may exhibit a staggered (e.g., discontinuous) structure wherein the die ring does not form a continuous structure around a periphery of the semiconductor die, when viewed from a top of the semiconductor die. The electrically coupled die rings may reduce or prevent arcing during material removal and patterning processes (e.g., etching, such as reactive ion etching, plasma etching, etc.) during fabrication of the semiconductor die. In some embodiments, the electrically connected die rings may exhibit less capacitor coupling than conventional die rings that are electrically isolated from each other. By way of comparison, dice including conventional die rings that are electrically isolated from each other do not exhibit an equipotential and may exhibit arcing during patterning processes. Such arcing may damage or even destroy the semiconductor die and the associated integrated circuitry. In some embodiments, staggered die rings may reduce an amount of capacitive coupling between die ring structures.

FIG. 1 is a top view of a semiconductor wafer 101 that may include a plurality of semiconductor dice 100. After the front end of the line and back end of the line fabrication are completed, the semiconductor wafer 101 may be divided into individual semiconductor dice 100, which may be physically separated from each other by scribe lines 102. The semiconductor wafer 101 may be cut at the scribe lines 102 to singulate the semiconductor dice 100 from each other in a "dicing" operation.

Figure 2A:
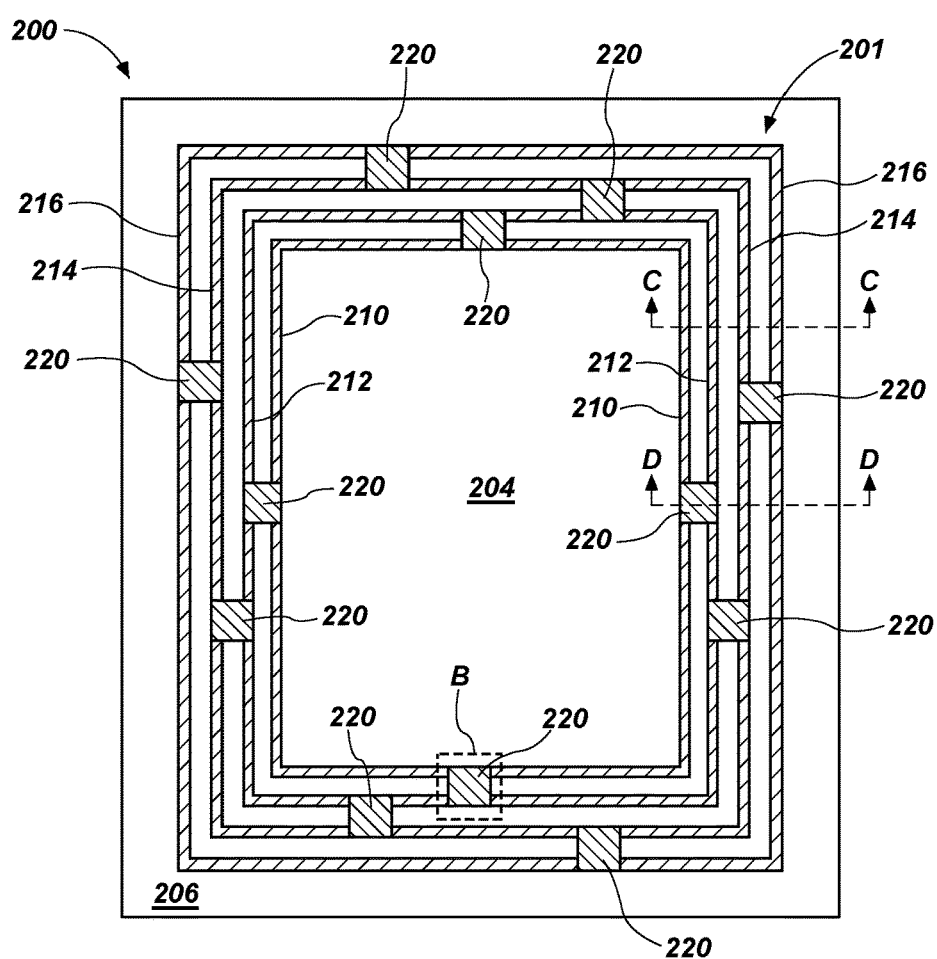
FIG. 2A is a top view of a semiconductor die including die rings electrically connected by electrically conductive interconnects, according to embodiments of the disclosure.

FIG. 2A is a top view of a semiconductor die 200 including a die ring structure 201 including a plurality of die rings 210, 212, 214, 216 located in a peripheral region 206 of the semiconductor die 200. The die ring structure 201 may be in the form of a ring structure surrounding an integrated circuitry region 204 of the semiconductor die 200. In some embodiments, the die ring structure 201 may have a rectangular shape. In other embodiments, the die ring structure 201 may have a square shape, a circular shape, an oval shape, or another shape.

The integrated circuitry region 204 may include active circuitry associated with, for example, 3D NAND semiconductor devices. In some such embodiments, the integrated circuitry region 204 may include alternating levels of a conductive material (e.g., polysilicon) and an insulative material (e.g., silicon dioxide). However, the disclosure is not so limited and the integrated circuitry region 204 may include other types of semiconductor devices.

In some embodiments, the die rings 210, 212, 214, 216 may extend from a surface of the semiconductor material of the die substrate to an upper, exposed surface of the semiconductor die 200. In some such embodiments, the die rings 210, 212, 214, 216 form a barrier structure (e.g., a "wall") that may reduce or prevent diffusion of materials from the peripheral region 206 to the integrated circuitry region 204 of the semiconductor die 200. The die rings 210, 212, 214, 216 may reduce or prevent moisture and ionic contaminants from penetrating into the integrated circuitry region 204. The die ring structure 201 may also reduce or prevent delamination of materials (e.g., dielectric materials) of the semiconductor die 200 during dicing (e.g., sawing) operations. In some embodiments, the die rings 210, 212, 214, 216 provide mechanical support to the semiconductor die 200.

The die rings 210, 212, 214, 216 may include electrically conductive structures, such as electrically conductive traces, electrically conductive lines, electrically conductive pads, electrically conductive vias, and combinations thereof. The die rings 210, 212, 214, 216 may include one or more electrically conductive materials. By way of nonlimiting example, the die rings 210, 212, 214, 216 may comprise tungsten, aluminum, silver, polysilicon, titanium, titanium nitride, copper, ruthenium, cobalt, tantalum, tantalum nitride, another conductive material, and combinations thereof.

In some embodiments, each die ring 210, 212, 214, 216 may comprise a continuous electrically conductive structure disposed around the integrated circuitry region 204. The continuous electrically conductive structure may be continuous when viewed from a top of the semiconductor die 200. In some such embodiments, each die ring 210, 212, 214, 216 may not include any interruptions therein, such that an electric potential at a first portion of each die ring 210, 212, 214, 216 may be substantially the same as an electric potential at an opposite side of the respective die ring.

Electrically conductive interconnects 220 may electrically connect one or more of the first die ring 210, the second die ring 212, the third die ring 214, and the fourth die ring 216 to another of the first die ring 210, the second die ring 212, the third die ring 214, and the fourth die ring 216. The electrically conductive interconnects 220 may extend laterally between at least one die ring 210, 212, 214, 216 and at least another die ring 210, 212, 214, 216. The electrically conductive interconnects 220 may comprise an electrically conductive material. By way of nonlimiting example, the electrically conductive interconnects 220 may comprise tungsten, aluminum, silver, polysilicon, titanium, titanium nitride, copper, ruthenium, cobalt, tantalum, tantalum nitride, another conductive material, and combinations thereof. In some embodiments, the electrically conductive interconnects 220 comprise the same material as the die rings 210, 212, 214, 216. In some such embodiments, the electrically conductive interconnects 220 may comprise tungsten.

In some embodiments, the first die ring 210 may be electrically coupled to the second die ring 212 through one or more electrically conductive interconnects 220, the second die ring 212 may be electrically coupled to the third die ring 214 through one or more electrically conductive interconnects 220, and the third die ring 214 may be electrically coupled to the fourth die ring 216 through one or more electrically conductive interconnects 220. In some embodiments, each die ring 210, 212, 214, 216 may be electrically connected to at least another die ring 210, 212, 214, 216 on each side of the semiconductor die 200. In other words, each side of the semiconductor die 200 may include at least one electrically conductive interconnect 220 electrically connecting the first die ring 210 to the second die ring 212, at least one electrically conductive interconnect 220 electrically connecting the second die ring 212 to the third die ring 214, and at least one electrically conductive interconnect 220 electrically connecting the third die ring 214 to the fourth die ring 216.

Although FIG. 2A illustrates only four electrically conductive interconnects 220 between the first die ring 210 and the second die ring 212, four electrically conductive interconnects 220 between the second die ring 212 and the third die ring 214, and four electrically conductive interconnects 220 between the third die ring 214 and the fourth die ring 216, the disclosure is not so limited. In some embodiments, each side of the semiconductor die 200 may include between about five electrically conductive interconnects 220 and twenty electrically conductive interconnects 220, such as between five and about ten electrically conductive interconnects 220, between ten and fifteen electrically conductive interconnects 220, or between fifteen and twenty electrically conductive interconnects 220 between each of the first die ring 210 and the second die ring 212, between the second die ring 212 and the third die ring 214, and between the third die ring 214 and the fourth die ring 216.

In some embodiments, each side of each of the die rings 210, 212, 214, 216 may be coupled to at least about four electrically conductive interconnects 220, at least about eight electrically conductive interconnects 220, at least about twelve electrically conductive interconnects 220, at least about sixteen electrically conductive interconnects 220, at least about twenty electrically conductive interconnects, at least about twenty electrically conductive interconnects, or at least about twenty-five electrically conductive interconnects 220.

In some embodiments, vertical sides (e.g., edges of the die rings 210, 212, 214, 216 extending up and down on the page in the view illustrated in FIG. 2A) of the die rings 210, 212, 214, 216 may be electrically coupled to more electrically conductive interconnects 220 than horizontal sides (e.g., edges of the die rings 210, 212, 214, 216 extending perpendicular to the vertical edges thereof and extending from left to right in the view illustrated in FIG. 2A) thereof. The vertical sides and the horizontal sides of the die rings 210, 212, 214, 216 may extend in a direction that is parallel to a major surface of the semiconductor die 200.

In some embodiments, the vertical sides of the die rings 210, 212, 214, 216 may be electrically coupled to between about fifteen and about twenty-five electrically conductive interconnects 220, such as between about fifteen and about seventeen, between about seventeen and about nineteen, between about nineteen and about twenty-one, between about twenty-one and about twenty-three, or between about twenty-three and about twenty-five electrically conductive interconnects 220. In some embodiments, each vertical side of the die rings 210, 212, 214, 216 may be electrically coupled to nineteen or twenty electrically conductive interconnects 220. The horizontal sides of the die rings 210, 212, 214, 216 may be electrically coupled to between about ten and about twenty electrically conductive interconnects 220, such as between about ten and about twelve, between about twelve and about fourteen, between about fourteen and about sixteen, between about sixteen and about eighteen, or between about eighteen and about twenty electrically conductive interconnects 220. In some embodiments, the horizontal sides of the die rings 210, 212, 214, 216 may be electrically coupled to fourteen or fifteen electrically conductive interconnects 220.

Figure 2B:
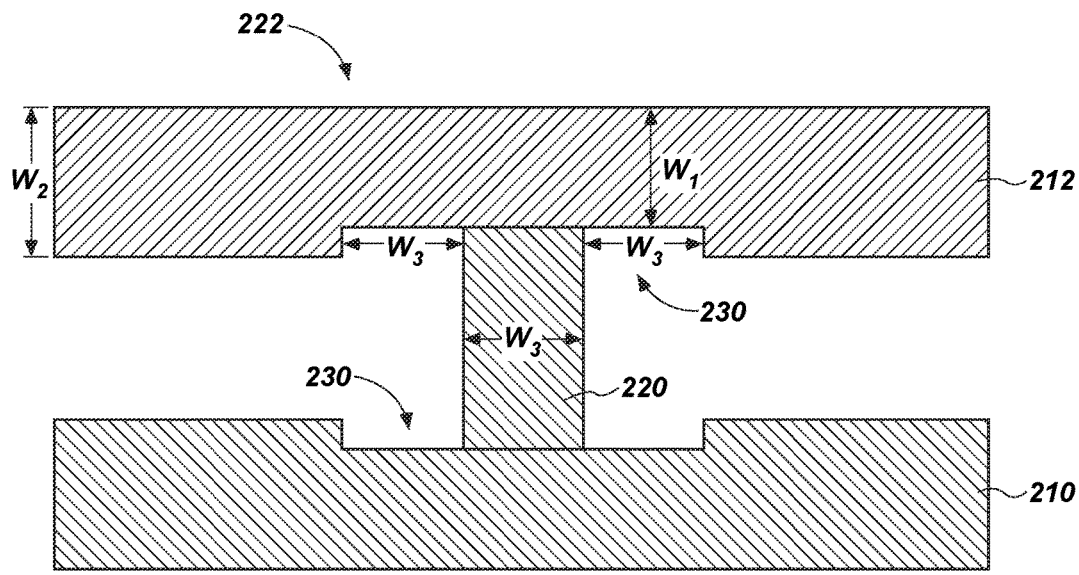
FIG. 2B is a top view of an interconnect between a first die ring and a second die ring taken from dashed box B in FIG. 2A.

FIG. 2B is a top view of an interconnect structure 222 comprising the electrically conductive interconnect 220 between the first die ring 210 and the second die ring 212 taken from dashed box B of FIG. 2A. Although FIG. 2B illustrates the electrically conductive interconnect 220 between only the first die ring 210 and the second die ring 212, it will be understood that the electrically conductive interconnects 220 between the other die rings may be similar to the illustrated electrically conductive interconnect 220.

The electrically conductive interconnect 220 may extend from the first die ring 210 to the second die ring 212. The first die ring 210 and the second die ring 212 may include a recessed portion 230 in the width of the first die ring 210 and the second die ring 212 at locations proximate the electrically conductive interconnect 220. The first die ring 210 and the second die ring 212 may have a width $W_1$ at regions contacting and proximate to the electrically conductive interconnect 220 and may have a width $W_2$ at locations that are distal from the electrically conductive interconnect 220.

In some embodiments, the width $W_1$ may be less than the width $W_2$. The width $W_1$ may be between about 40 percent and about 80 percent of the width $W_2$, such as between about 40 percent and about 50 percent of the width $W_2$, between about 50 percent and about 60 percent of the width $W_2$, between about 60 percent and about 70 percent of the width $W_2$, or between about 70 percent and about 80 percent of the width $W_2$. In some embodiments, the width $W_1$ may be equal to about 75 percent of the width $W_2$.

The electrically conductive interconnect 220 may have a width $W_3$ that may be equal to the width $W_1$. Accordingly, in some embodiments, the width $W_3$ of the electrically conductive interconnect 220 may equal the width $W_1$ of the die rings 210, 212 at locations proximate where the electrically conductive interconnect 220 intersects the die rings 210, 212. In some embodiments, sidewalls of the electrically conductive interconnect 220 may be separated longitudinally from sidewalls of thickness $W_2$ of the die rings 210, 212 by the width $W_3$. In some embodiments, the interconnect structure 222 may be formed using optical proximity correction (OPC) to facilitate forming the electrically conductive interconnect 220 as depicted in and described with respect to FIG. 2B in electrical communication with each of the first die ring 210 and the second die ring 212.

In some embodiments, the reduced width $W_1$ of the first die ring 210 and the second die ring 212 at regions contacted by the electrically conductive interconnect 220 may reduce an area of the interconnect structure 222. Reducing the area of the interconnect structure 222 may reduce an area exposed to an etchant during patterning of the interconnect structure 222. Since an etch rate may be proportional to an area that is exposed to the etchant, reducing the exposed area of the interconnect structure 222 may reduce an etch rate thereof relative to other portions of the die rings 210, 212, 214, 216. In other words, forming the interconnect structure 222 to include the recessed portion 230 at the intersection of the electrically conductive interconnect 220 with each of the first die ring 210 and the second die ring 212 may reduce an etch rate of the interconnect structure 222 relative to portions of the first die ring 210 and the second die ring 212 outside the interconnect structure 222 (e.g., having the width $W_2$).

Figure 2C:
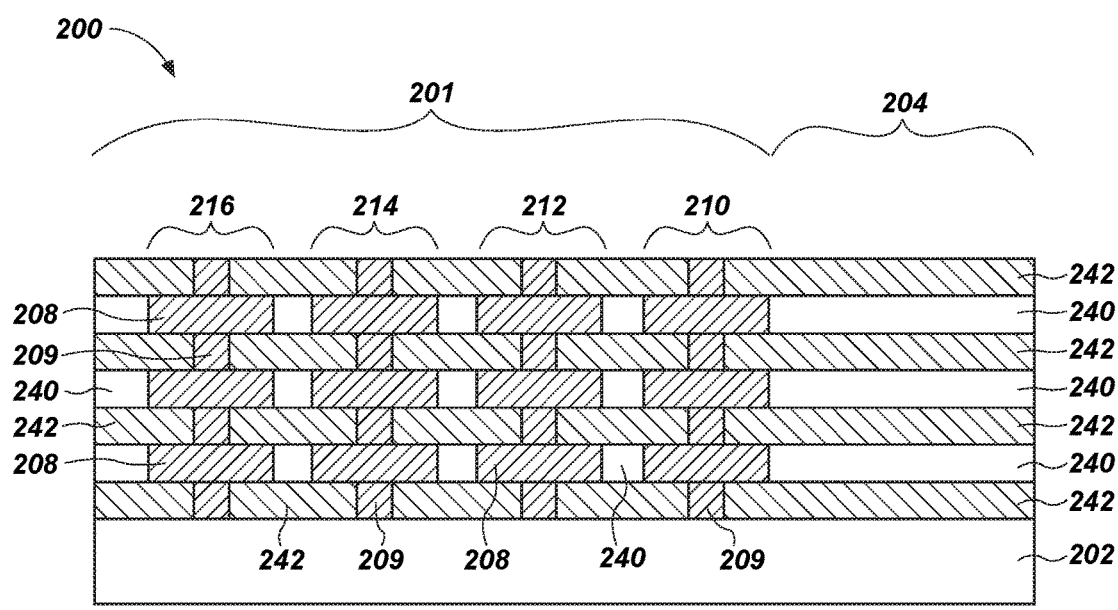
FIG. 2C is a cross-sectional view of the semiconductor die taken along section line C-C of FIG. 2A.

FIG. 2C is a cross-sectional view of the semiconductor die 200 taken along section line C-C in FIG. 2A. As described above, each of the die rings 210, 212, 214, 216 may define an electrically conductive path between a surface of the material of the semiconductor die substrate 202 and an exposed surface of the semiconductor die 200. The die ring structure 201 may be located adjacent the integrated circuitry region 204 of the semiconductor die 200 and may include the first die ring 210, the second die ring 212, the third die ring 214, and the fourth die ring 216. In embodiments where the integrated circuitry region 204 includes active circuitry associated with, for example, 3D NAND semiconductor devices, the integrated circuitry region 204 may include alternating regions of conductive material 240 (e.g., polysilicon) and insulative material 242 (e.g., silicon dioxide).

Each die ring 210, 212, 214, 216 may define an electrically conductive path from a surface of the material of the semiconductor die substrate 202 to an upper surface of the semiconductor die 200. By way of nonlimiting example, each of the first die ring 210, the second die ring 212, the third die ring 214, and the fourth die ring 216 may include interconnected conductive pads 208 and conductive vias 209 extending from the surface of the material of the semiconductor die substrate 202 to an upper surface of the semiconductor die 200. In some embodiments, the conductive pads 208 may comprise a continuous structure forming a ring around a periphery of the semiconductor die 200.

The conductive pads 208 and the conductive vias 209 may include tungsten, aluminum, silver, polysilicon, titanium, titanium nitride, copper, ruthenium, cobalt, tantalum, tantalum nitride, another conductive material, and combinations thereof. In some embodiments, the conductive pads 208 and conductive vias 209 comprise tungsten.

The insulative material 242 may surround the conductive pads 208 and the conductive vias 209. The insulative material 242 may include, by way of nonlimiting example, silicon dioxide, silicon nitride, spin-on dielectric material, or another dielectric material.

Figure 2D:
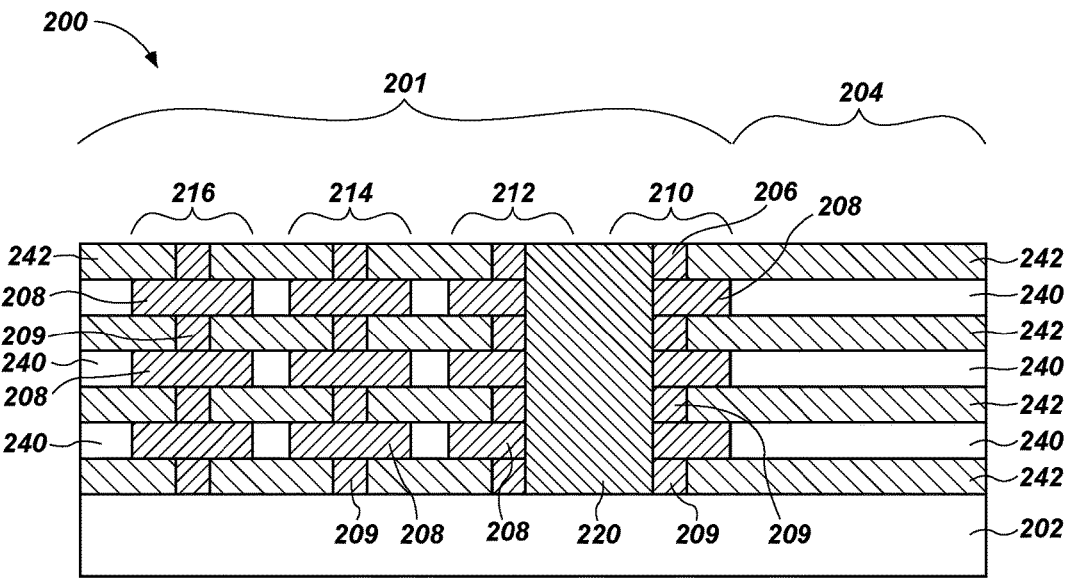
FIG. 2D is a cross-sectional view of the semiconductor die taken along section line D-D of FIG. 2A.

FIG. 2D is a cross-sectional view of the semiconductor die 200 taken along section line D-D in FIG. 2A and illustrates an electrically conductive interconnect 220 between the first die ring 210 and the second die ring 212. The electrically conductive interconnect 220 may electrically couple the first die ring 210 to the second die ring 212 and may extend from an upper surface of the semiconductor die 200 to the surface of the material of the semiconductor die substrate 202.

The electrically conductive interconnect 220 between the first die ring 210 and the second die ring 212 may reduce a likelihood of arcing between the first die ring 210 and the second die ring 212 during patterning processes (e.g., during etching of the materials in the die, such as materials in the integrated circuitry region 204). By way of nonlimiting example, the electrically conductive interconnect 220 may reduce or even prevent arcing during plasma etching processes, such as reactive ion etching processes.

Figure 2E:
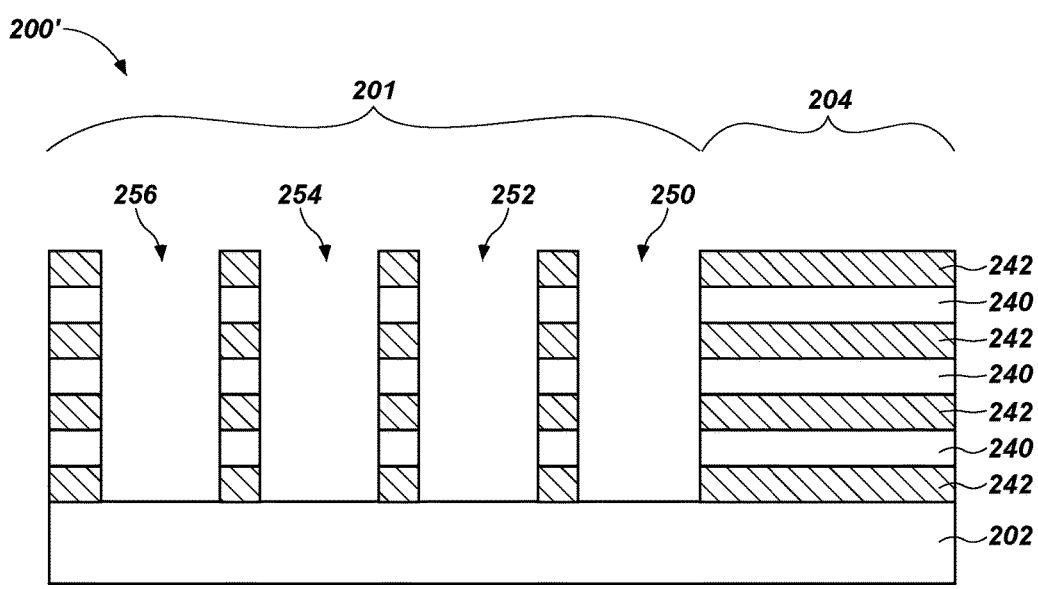
FIG. 2E is a cross-sectional view of a semiconductor die during fabrication thereof.

Without wishing to be bound by any particular theory, it is believed that electrically connecting the first die ring 210 and the second die ring 212 through the electrically conductive interconnect 220 may cause an electric potential of the first die ring 210 to be substantially equal to the electrical potential of the second die ring 212, such as during fabrication of the die ring structure 201. In other words, the first die ring 210 and the second die ring 212 may exhibit an equipotential. Accordingly, since the first die ring 210 and the second die ring 212 are electrically coupled, the first die ring 210 and the second die ring 212 may not be capacitively coupled. Referring to FIG. 2E, a semiconductor die 200' is illustrated during fabrication of the die ring structure 201 (FIG. 2A). The semiconductor die 200' may include trenches 250, 252, 254, 256 formed at locations corresponding to the first die ring 210, the second die ring 212, the third die ring 214, and the fourth die ring 216, respectively. The trenches 250, 252, 254, 256 may extend through alternating conductive materials 240 and insulative materials 242, such as in NAND semiconductor devices. During fabrication of the die ring structure 201 (FIG. 2A), a dry etch process used to form the trenches 250, 252, 254, 256 may include electrons, ions, or both that may charge the conductive materials 240. Different portions of the semiconductor die 200' may exhibit differences in stored electrical charge. The magnitude of the differences in stored electrical charges may increase as the depth of the trenches 250, 252, 254, 256 increases. It is believed that since the first die ring 210 and the second die ring 212 are electrically connected, the electric potential of the first die ring 210 and the second die ring 212 may be balanced before any arcing may occur. Accordingly, during etching processes, such as dry etching processes including plasma etching (e.g., reactive ion etching), charges that may undesirably accumulate on the first die ring 210 and the second die ring 212 do not arc between each other since the first die ring 210 and the second die ring 212 exhibit an equipotential. By way of comparison, in embodiments wherein the first die ring 210 and the second die ring 212 are not electrically connected, a separate and different charge may accumulate in each of the first die ring 210 and the second die ring 212 and an arc may form between the first die ring 210 and the second die ring 212. It is believed that where the first die ring 210 and the second die ring 212 are not in electrical communication, each die ring 210, 212 may act as a capacitor plate and may store a charge during such etching processes. After a significant charge has been stored, the charge may discharge, which may form an arc between the die rings 210, 212. The arc may be an explosive event that may damage the semiconductor die 200 and integrated circuitry thereof.

With reference back to FIG. 2A, since each of the first die ring 210, the second die ring 212, the third die ring 214, and the fourth die ring 216 are electrically connected through the electrically conductive interconnects 220, each of the die rings 210, 212, 214, 216 may exhibit substantially the same electric potential. Accordingly, the electrically conductive interconnects 220 may reduce or even prevent arcing between any of the die rings 210, 212, 214, 216 during patterning processes since the die rings 210, 212, 214, 216 may not be capacitively coupled to each other.

Although the die ring structure 201 has been described as including four die rings, each of the die rings comprising a continuous electrically conductive structure around the integrated circuitry region, the disclosure is not so limited. In other embodiments, the die ring structure 201 may include fewer or more die rings, such as two die rings, three die rings, five die rings, six die rings, etc. In some such embodiments, the die rings may be in electrical communication with each other through one or more electrically conductive interconnects.

Figure 3:
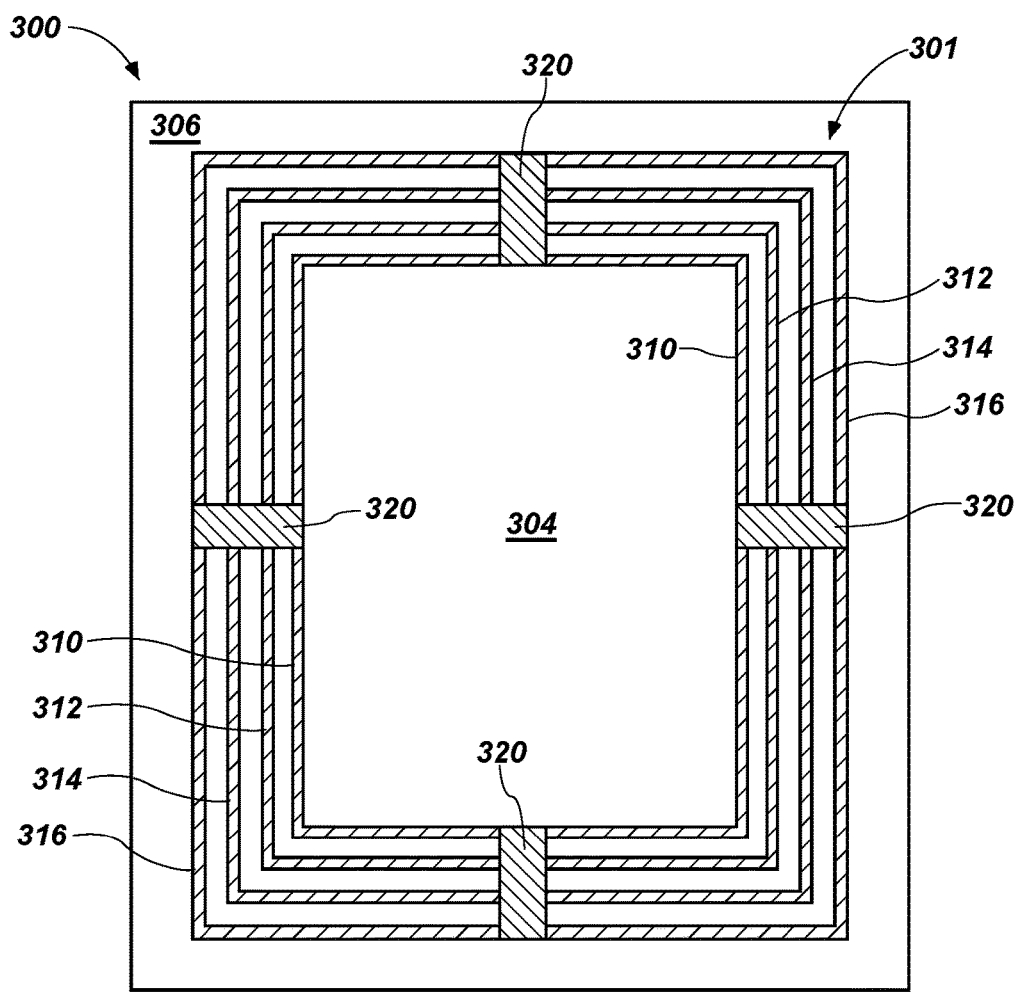
FIG. 3 is a top view of a semiconductor die including die rings electrically connected by electrically conductive interconnects, according to embodiments of the disclosure.

Although FIG. 2A through FIG. 2D have been described as including electrically conductive interconnects 220 that each extend only between adjacent die rings 210, 212, 214, 216, the disclosure is not so limited. In other embodiments, the electrically conductive interconnects 220 may electrically connect more than two die rings. FIG. 3 is a top view of a semiconductor die 300 including electrically conductive interconnects 320 electrically connecting different portions of a die ring structure 301. The die ring structure 301 may be located in a peripheral region 306 and disposed around an integrated circuitry region 304 of the semiconductor die 300. The die ring structure 301 may include a first die ring 310 electrically connected to each of a second die ring 312, a third die ring 314, and a fourth die ring 316, each of which may be electrically connected to each other with one or more electrically conductive interconnects 320. Accordingly, in some embodiments, each die ring may be in electrical communication with the other die rings through one or more electrically conductive interconnects 320. For example, the first die ring 310 may be electrically connected to each of the second die ring 312, the third die ring 314, and the fourth die ring 316, the second die ring 312 may be electrically connected to the first die ring 310, the third die ring 314, and the fourth die ring 316, the third die ring 314 may be electrically connected to the first die ring 310, the second die ring 312, and the fourth die ring 316, and the fourth die ring 316 may be electrically connected to the first die ring 310, the second die ring 312, and the third die ring 314 though one or more electrically conductive interconnects 320. In some embodiments, each electrically conductive interconnect 320 may electrically couple all of the die rings.

Although FIG. 3 illustrates only four electrically conductive interconnects 320, the disclosure is not so limited. In other embodiments, each side of the die may include between two and twenty electrically conductive interconnects 320, such as between two and five electrically conductive interconnects 320, between five and ten electrically conductive interconnects 320, between ten and fifteen electrically conductive interconnects 320, or between fifteen and twenty electrically conductive interconnects 320 electrically connecting the die rings 310, 312, 314, 316 to each other.

In some embodiments, vertical sides (e.g., edges) of the first die ring 310, the second die ring 312, the third die ring 314, and the fourth die ring 316 may be electrically coupled to more electrically conductive interconnects 320 than horizontal sides (e.g., edges) thereof. In some embodiments, the vertical sides of the die rings 310, 312, 314, 316 may be electrically coupled to between about fifteen and about twenty-five electrically conductive interconnects 320, such as between about fifteen and about seventeen, between about seventeen and about nineteen, between about nineteen and about twenty-one, between about twenty-one and about twenty-three, or between about twenty-three and about twenty-five electrically conductive interconnects 320. In some embodiments, each vertical side of the die rings 310, 312, 314, 316 may be electrically coupled to nineteen or twenty electrically conductive interconnects 320. The horizontal sides of the die rings 310, 312, 314, 316 may be electrically coupled to between about ten and about twenty electrically conductive interconnects 320, such as between about ten and about twelve, between about twelve and about fourteen, between about fourteen and about sixteen, between about sixteen and about eighteen, or between about eighteen and about twenty electrically conductive interconnects 320. In some embodiments, the horizontal sides of the die rings 310, 312, 314, 316 may be electrically coupled to fourteen or fifteen electrically conductive interconnects 320.

Figure 4:
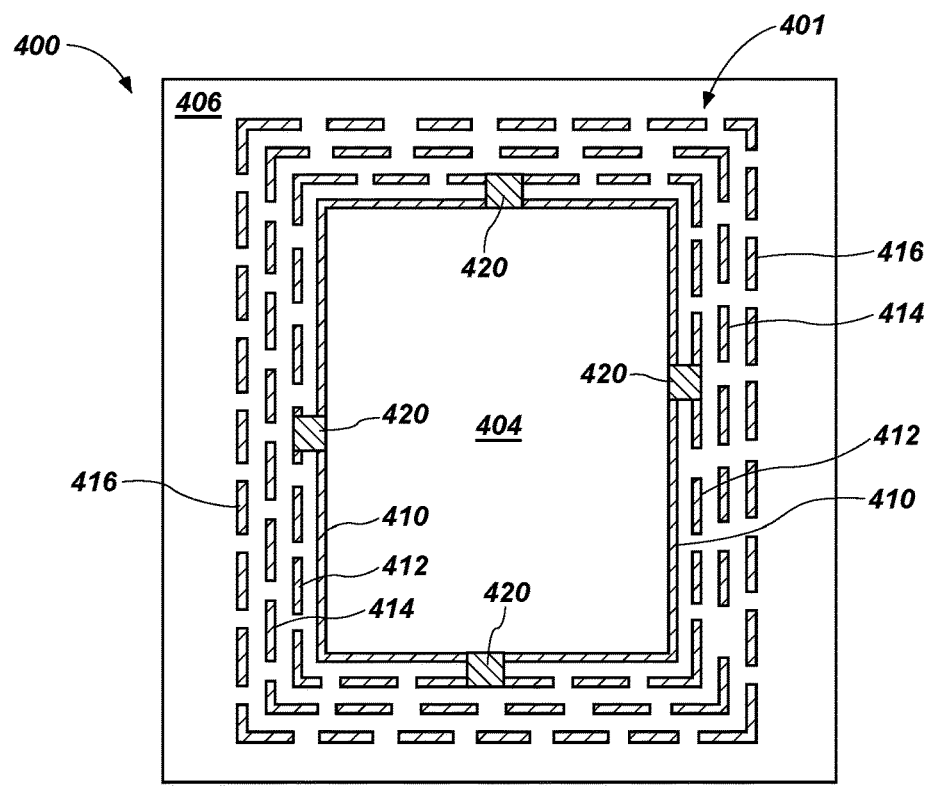
FIG. 4 is a top view of a semiconductor die including die rings electrically connected by electrically conductive interconnects, according to other embodiments of the disclosure.

FIG. 4 is a top view of another semiconductor die 400 including a die ring structure 401, according to another embodiment of the disclosure. The semiconductor die 400 may include an integrated circuitry region 404 including active circuitry and a plurality of die rings disposed in a peripheral region 406 around the integrated circuitry region 404.

The die rings may include a first die ring 410, a second die ring 412, a third die ring 414, and a fourth die ring 416. The first die ring 410 may include a continuous structure (when viewed from a top of the semiconductor die 400) extending around the integrated circuitry region 404 of the semiconductor die 400. The first die ring 410 may be substantially the same as the first die ring 210 described above with reference to FIG. 2A and FIG. 2C.

The second die ring 412 may include a staggered electrically conductive structure comprising discontinuous segments disposed around the first die ring 410 when viewed from the top of the semiconductor die 400. In other words, a first portion of the second die ring 412 may not be in direct electrical communication with other portions of the second die ring 412. The third die ring 414 may include a staggered electrically conductive structure comprising discontinuous segments disposed around the second die ring 412. The fourth die ring 416 may include a staggered electrically conductive structure comprising discontinuous segments disposed around the third die ring 414.

Electrically conductive interconnects 420 may electrically connect the continuous first die ring 410 to different portions of the staggered second die ring 412. Although FIG. 4 illustrates four electrically conductive interconnects 420 electrically connecting the first die ring 410 to the second die ring 412, the disclosure is not so limited. In other embodiments, the semiconductor die 400 may include more than one electrically conductive interconnect 420 between the first die ring 410 and the second die ring 412 at each side of the semiconductor die 400. In some embodiments, each side of the first die ring 410 may be electrically connected to the second die ring 412 with between about two and about twenty-five electrically conductive interconnects 420, such as between about two and about five, between about five and about ten, between about ten and about fifteen, between about fifteen and about twenty, or between about twenty and about twenty-five electrically conductive interconnects 420.

In some embodiments, vertical sides (e.g., edges) of the die rings 410, 412, 414, 416 may be electrically coupled to more electrically conductive interconnects 420 than horizontal sides (e.g., edges) thereof. In some embodiments, the vertical sides of the die rings 410, 412, 414, 416 may be electrically coupled to between about fifteen and about twenty-five electrically conductive interconnects 420, such as between about fifteen and about seventeen, between about seventeen and about nineteen, between about nineteen and about twenty-one, between about twenty-one and about twenty-three, or between about twenty-three and about twenty-five electrically conductive interconnects 420. In some embodiments, each vertical side of the die rings 410, 412, 414, 416 may be electrically coupled to nineteen or twenty electrically conductive interconnects 420. The horizontal sides of the die rings 410, 412, 414, 416 may be electrically coupled to between about ten and about twenty electrically conductive interconnects, such as between about ten and about twelve, between about twelve and about fourteen, between about fourteen and about sixteen, between about sixteen and about eighteen, or between about eighteen and about twenty electrically conductive interconnects 420. In some embodiments, the horizontal sides of the die rings 410, 412, 414, 416 may be electrically coupled to fourteen or fifteen electrically conductive interconnects 420.

Although FIG. 4 illustrates that the electrically conductive interconnects 420 electrically couple the first die ring 410 to only the second die ring 412, the disclosure is not so limited. In other embodiments, the first die ring 410 may be in electrical communication with one or both of the third die ring 414 and the fourth die ring 416 by one or more electrically conductive interconnects 420.

Without wishing to be bound by any particular theory, the die ring structure 401 including only one continuous die ring (e.g., the continuous first die ring 410) may reduce a likelihood of forming a capacitor-like structure between adjacent die rings and, therefore, may reduce a likelihood of capacitor charging between adjacent die rings. In addition, the discontinuous segments of the second die ring 412, the third die ring 414, and the fourth die ring 416 may reduce an amount of charge that may accumulate on any particular portion of such die rings. In other words, the discontinuous segments may reduce an amount of capacitive coupling between conductive structures compared to conventional semiconductor devices. Further, electrically coupling the first die ring 410 to the second die ring 412 with the electrically conductive interconnects 420 may form an equipotential between the first die ring 410 and the second die ring 412. Accordingly, arcing between die rings may be reduced or prevented during etching operations.

Although FIG. 4 illustrates that the continuous die ring comprises the first die ring 410, the disclosure is not so limited. In other embodiments, at least one of the second die ring 412, the third die ring 414, and the fourth die ring 416 may comprise a continuous electrically conductive structure around the integrated circuitry region 404 while the first die ring 410 comprises a staggered structure comprising discontinuous segments. In some such embodiments, the electrically conductive interconnects 420 may be between the continuous die ring and at least one adjacent die ring. Stated another way, in some embodiments, the first die ring 410 may comprise discontinuous segments and at least one of the second die ring 412, the third die ring 414, and the fourth die ring 416 may comprise a continuous electrically conductive structure.

Figure 5:
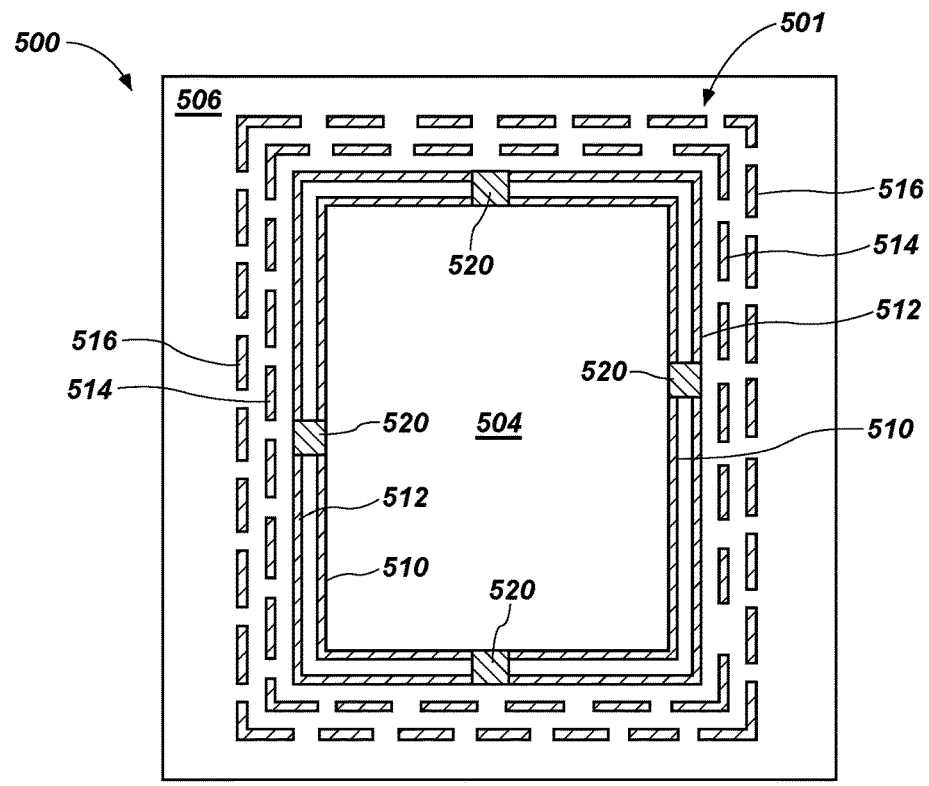
FIG. 5 is a top view of a semiconductor die including a die ring structure including die rings electrically connected by electrically conductive interconnects, according to yet other embodiments of the disclosure.

FIG. 5 is a top view of a semiconductor die 500 including a die ring structure 501, according to another embodiment of the disclosure. The die ring structure 501 may include a first die ring 510 disposed around an integrated circuitry region 504, a second die ring 512 disposed around the first die ring 510, a third die ring 514 disposed around the second die ring 512, and a fourth die ring 516 disposed around the third die ring 514. The die rings 510, 512, 514, 516 may be disposed in a peripheral region 506 of the semiconductor die 500.

The first die ring 510 and the second die ring 512 may each comprise a continuous electrically conductive structure extending around the integrated circuitry region 504. The first die ring 510 and the second die ring 512 may be substantially the same as the first die ring 210 described above with reference to FIG. 2A and FIG. 2C. The third die ring 514 may include a staggered electrically conductive structure comprising discontinuous segments disposed around the second die ring 512. The fourth die ring 516 may include a staggered electrically conductive structure comprising discontinuous segments around the third die ring 514.

Electrically conductive interconnects 520 may electrically connect the continuous first die ring 510 to continuous second die ring 512. Although FIG. 5 illustrates four electrically conductive interconnects 520 electrically connecting the first die ring 510 to the second die ring 512, the disclosure is not so limited. In other embodiments, the semiconductor die 500 may include more than one electrically conductive interconnect 520 between the first die ring 510 and the second die ring 512 at each side of the semiconductor die 500. In some embodiments, each side of the first die ring 510 may be electrically connected to the second die ring 512 with between about two and about twenty-five electrically conductive interconnects 520, such as between about two and about five, between about five and about ten, between about ten and about fifteen, between about fifteen and about twenty, or between about twenty and about twenty-five electrically conductive interconnects 520.

As described above with reference to FIG. 2 through FIG. 4, the vertical sides of the die rings 510, 512, 514, 516 may be electrically coupled to more electrically conductive interconnects that the horizontal sides thereof.

Although FIG. 5 illustrates that the electrically conductive interconnects 520 electrically couple the first die ring 510 to only the second die ring 512, the disclosure is not so limited. In other embodiments, the first die ring 510 may be in electrical communication with one or both of the third die ring 514 and the fourth die ring 516 by one or more electrically conductive interconnects 520. Similarly, the second die ring 512 may be in electrical communication with one or both of the third die ring 514 and the fourth die ring 516 by one or more electrically conductive interconnects 520.

Although FIG. 5 has been described as including the first die ring 510 and the second die ring 512 comprising the continuous electrically conductive structure and the third die ring 514 and the fourth die ring 516 comprising a staggered electrically conductive structure, the disclosure is not so limited. In other embodiments, the die ring structure 501 may include two continuous die rings, such as the second die ring 512 and the third die ring 514, or the third die ring 514 and the fourth die ring 516 and two staggered die rings, such as the first die ring 510 and the fourth die ring 516, or the first die ring 510 and the second die ring 512. In yet other embodiments, the first die ring 510 and the third die ring 514 may comprise continuous electrically conductive structures and the second die ring 512 and the fourth die ring 516 may comprise staggered electrically conductive structures. In other embodiments, the first die ring 510 and the third die ring 514 may comprise staggered electrically conductive structures and the second die ring 512 and the fourth die ring 516 may comprise continuous electrically conductive structures.

Figure 6:
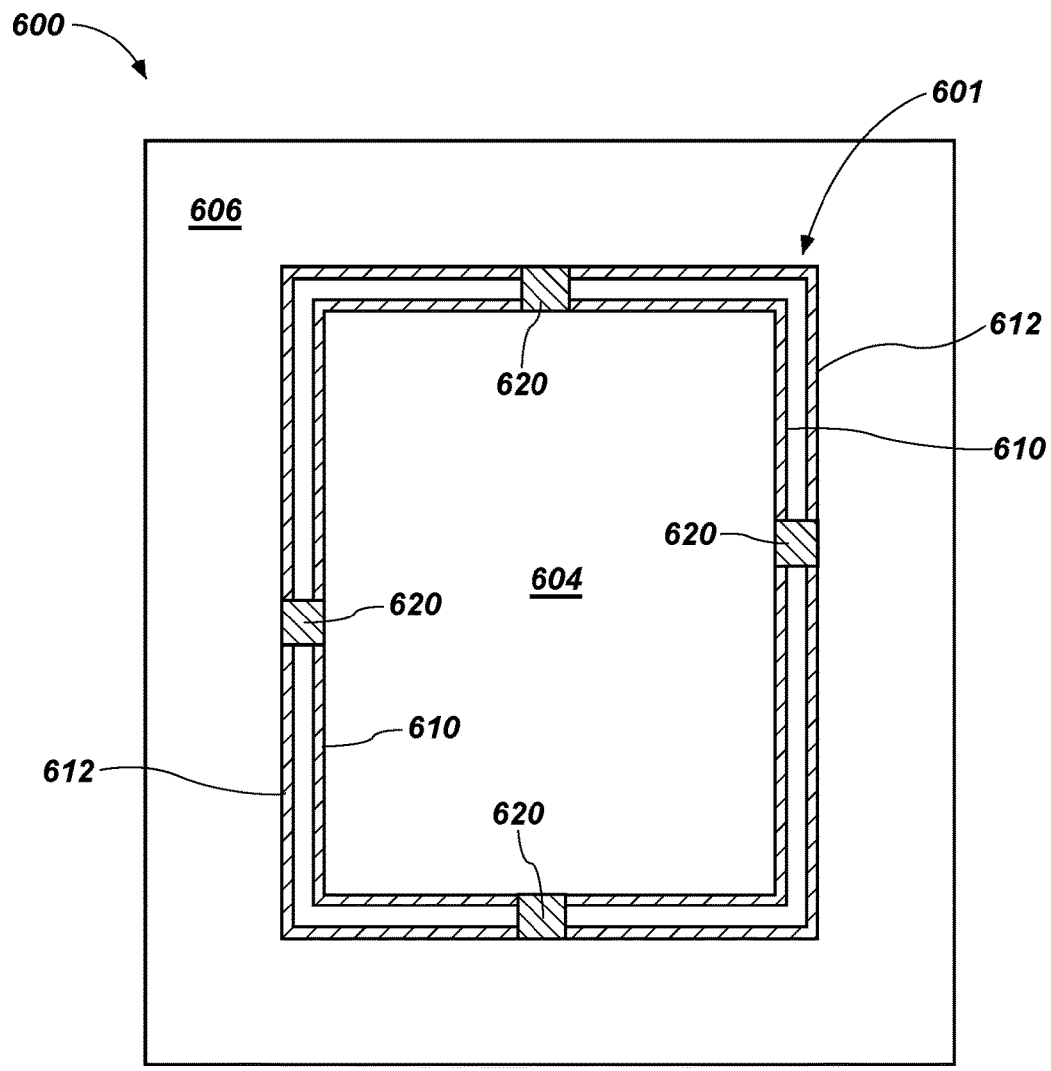
FIG. 6 is a top view of a semiconductor die including die rings electrically connected by electrically conductive interconnects, according to additional embodiments of the disclosure.

FIG. 6 is a top view of a semiconductor die 600 including die rings, according to another embodiment of the disclosure. The semiconductor die 600 may include an integrated circuitry region 604 and a peripheral region 606 disposed around the integrated circuitry region 604. A die ring structure 601 may include a first die ring 610 may be disposed in the peripheral region 606 and around the integrated circuitry region 604. A second die ring 612 may be disposed around the first die ring 610.

The first die ring 610 and the second die ring 612 may comprise a continuous electrically conductive structure extending around the integrated circuitry region 604. The first die ring 610 and the second die ring 612 may be substantially the same as the first die ring 210 described above with reference to FIG. 2A and FIG. 2C.

Electrically conductive interconnects 620 may electrically connect the continuous first die ring 610 to continuous second die ring 612. Although FIG. 6 illustrates four electrically conductive interconnects 620 electrically connecting the first die ring 610 to the second die ring 612, the disclosure is not so limited. In other embodiments, the semiconductor die 600 may include more than one electrically conductive interconnect 620 between the first die ring 610 and the second die ring 612 at each side of the semiconductor die 600. In some embodiments, each side of the first die ring 610 may be electrically connected to the second die ring 612 with between two electrically conductive interconnects 620 and twenty-five electrically conductive interconnects 620, such as between about two and about five, between about five and about ten, or between about ten and about fifteen, between about fifteen and about twenty, or between about twenty and about twenty-five electrically conductive interconnects 620.

As described above with reference to FIG. 2 through FIG. 5, the vertical sides of the first die ring 610 and the second die ring 612 may be electrically coupled to more electrically conductive interconnects that the horizontal sides thereof.

Although the electrically conductive interconnects described above with reference to FIG. 2A through FIG. 6 have been described herein as extending from an upper surface of the die to the die substrate, the disclosure is not so limited. In some embodiments, the interconnects may not extend completely to the surface of the substrate. By way of nonlimiting example, the interconnects may extend over associated die rings, or between each associated die ring a partial depth below the surface to be in electrical communication with the die rings without extending to the surface of the die substrate.

Accordingly, in some embodiments, a semiconductor device comprises a semiconductor die comprising integrated circuitry, a first die ring comprising one or more electrically conductive materials at least partially surrounding the integrated circuitry, the one or more electrically conductive materials comprising an electrically conductive path from a surface of the semiconductor die into the semiconductor die, a second die ring comprising an electrically conductive material disposed around the first die ring, and a first electrically conductive interconnect electrically connecting the first die ring and to second die ring.

Accordingly, in other embodiments, a semiconductor die comprises a first die ring in a peripheral region of a semiconductor die, the first die ring comprising a continuous electrically conductive structure extending from an upper surface of the semiconductor die into the semiconductor die and comprising an electrically conductive material, a second die ring around the first die ring, the second die ring comprising an electrically conductive material, and a first electrically conductive interconnect electrically connecting the first die ring to the second die ring.

Accordingly, in some embodiments, a semiconductor device comprises a first die ring extending around integrated circuitry of a semiconductor die, wherein the first die ring comprises a continuous electrically conductive structure extending around the integrated circuitry, a second die ring comprising an electrically conductive material around the first die ring, and electrically conductive interconnects electrically coupling the first die ring to the second die ring.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device, comprising: a semiconductor die comprising integrated circuitry; a first die ring comprising one or more electrically conductive materials at least partially surrounding the integrated circuitry, the one or more electrically conductive materials comprising an electrically conductive path extending through alternating levels of a conductive material and an insulative material; a second die ring comprising an electrically conductive material disposed around the first die ring; and a third die ring comprising an electrically conductive material disposed around the second die ring, each of the first die ring, the second die ring, and the third die ring coupled to an adjacent die ring by electrically conductive interconnects that are physically spaced from one another, the electrically conductive interconnects extending from a surface of the semiconductor die into the semiconductor die through the alternating levels of the conductive material and the insulative material.

2. The semiconductor device of claim 1, wherein the first die ring and the second die ring each comprise conductive pads and conductive vias forming the electrically conductive path from proximate a surface of a substrate to the surface of the semiconductor die.

3. The semiconductor device of claim 1, wherein the first die ring, the second die ring, and the electrically conductive interconnects comprise tungsten.

4. The semiconductor device of claim 1, wherein the first die ring exhibits a reduced width at a location proximate the electrically conductive interconnects relative to a width thereof distal to the electrically conductive interconnects.

5. The semiconductor device of claim 4, wherein the reduced width comprises between about fifty percent and about eighty percent of a width of the first die ring at locations of the first die ring distal from the electrically conductive interconnects.

6. The semiconductor device of claim 1, wherein the third die ring is in electrical communication with the second die ring at least through an electrically conductive interconnect electrically isolated from an electrically conductive interconnect in electrical communication with the second die ring and the first die ring.

7. The semiconductor device of claim 1, wherein the third die ring comprises a discontinuous segmented structure, different portions of the third die ring electrically coupled to the second die ring with at least one electrically conductive interconnect different from an electrically conductive interconnect electrically connecting the first die ring to the second die ring, at least one portion of the third die ring electrically isolated from at least another portion of the third die ring.

8. The semiconductor device of claim 1, further comprising a fourth die ring disposed around the third die ring and in electrical communication with the third die ring.

9. The semiconductor device of claim 1, further comprising a fourth die ring disposed around the third die ring, wherein the third die ring is in electrical communication with the second die ring and comprises a continuous structure around the second die ring, and wherein the fourth die ring is in electrical communication with the third die ring and comprises a continuous structure.

10. The semiconductor device of claim 1, wherein at least one of the first die ring and the second die ring comprises four edges, wherein each edge of the at least one of the first die ring and the second die ring is electrically connected to at least four electrically conductive interconnects.

11. The semiconductor device of claim 1, wherein vertical edges of the at least one of the first die ring and the second die ring are electrically connected to a greater number of electrically conductive interconnects than horizontal edges thereof.

12. A semiconductor die, comprising: a first die ring in a peripheral region of a semiconductor die, the first die ring comprising a continuous electrically conductive structure extending from an upper surface of the semiconductor die into the semiconductor die and comprising an electrically conductive material; a second die ring around the first die ring, the second die ring comprising an electrically conductive material; a third die ring around the second die ring; a first electrically conductive interconnect electrically connecting the first die ring to the second die ring, wherein a distance between the first die ring and the second die ring at a location proximate the first electrically conductive interconnect is greater than a distance between the first die ring and the second die ring at a location distal to the first electrically conductive interconnect; and a second electrically conductive interconnect electrically connecting the second die ring and the third die ring and physically separated from the first electrically conductive interconnect.

13. The semiconductor die of claim 12, wherein the second die ring is electrically connected to the first die ring with electrically conductive interconnects.

14. The semiconductor die of claim 12, wherein the first die ring is electrically connected to the second die ring with electrically conductive interconnects, wherein vertical edges of the first die ring are electrically coupled to more electrically conductive interconnects than horizontal edges thereof.

15. The semiconductor die of claim 12, wherein the second die ring comprises a discontinuous segmented structure extending around the first die ring, wherein a first portion of the second die ring and a second portion of the second die ring are electrically connected to the first die ring.

16. The semiconductor die of claim 12, wherein the first die ring, the second die ring, and the third die ring each comprise a continuous electrically conductive structure.

17. The semiconductor die of claim 12, wherein the first die ring and the second die ring each comprise a continuous electrically conductive structure and the third die ring comprises a discontinuous segmented electrically conductive structure.

18. The semiconductor die of claim 17, further comprising a fourth die ring disposed around the third die ring, wherein the fourth die ring is in electrical communication with the first die ring, the second die ring, and the third die ring through at least a third electrically conductive interconnect.

19. The semiconductor die of claim 18, wherein each of the first die ring, the second die ring, the third die ring, and the fourth die ring each comprise a continuous electrically conductive structure.

20. A semiconductor device, comprising: a first die ring extending around integrated circuitry of a semiconductor die, wherein the first die ring comprises a continuous electrically conductive structure extending around the integrated circuitry; a second die ring comprising an electrically conductive material around the first die ring; a third die ring extending around the second die ring; first electrically conductive interconnects electrically coupling the first die ring to the second die ring; and second electrically conductive interconnects electrically coupling the second die ring to the third die ring and physically separated from the first electrically conductive interconnects.

21. The semiconductor device of claim 20, wherein the second die ring comprises a discontinuous segmented structure extending around the first die ring.

22. The semiconductor device of claim 20, wherein the second die ring comprises a continuous electrically conductive structure extending around the first die ring.

23. The semiconductor device of claim 20, further comprising a fourth die ring extending around the third die ring, wherein the second die ring, the third die ring, and the fourth die ring each comprise a continuous electrically conductive structure.

24. The semiconductor device of claim 20, wherein the first electrically conductive interconnects electrically coupling the first die ring to the second die ring comprise a greater number of electrically conductive interconnects connecting vertically extending edges of the first die ring to vertically extending edges of the second die ring than a number of electrically conductive interconnects connecting horizontal edges of the first die ring to horizontal edges of the second die ring.

25. The semiconductor device of claim 20, wherein the first electrically conductive interconnects comprise at least about four electrically conductive interconnects electrically coupled to each side of the first die ring and each side of the second die ring.

* * * * *